United States Patent
Tate et al.

(10) Patent No.: US 10,389,388 B2
(45) Date of Patent: Aug. 20, 2019

(54) EFFICIENT LDPC DECODING WITH PREDEFINED ITERATION-DEPENDENT SCHEDULING SCHEME

(71) Applicant: Apple Inc., Cupertino, CA (US)

(72) Inventors: Yonathan Tate, Kfar Saba (IL); Tomer Ish-Shalom, Ra'anana (IL)

(73) Assignee: APPLE INC., Cupertino, CA (US)

(*) Notice: Subject to any disclaimer, the term of this patent is extended or adjusted under 35 U.S.C. 154(b) by 76 days.

(21) Appl. No.: 15/856,107

(22) Filed: Dec. 28, 2017

(65) Prior Publication Data

US 2019/0207630 A1    Jul. 4, 2019

(51) Int. Cl.
*H03M 13/37* (2006.01)
*H03M 13/11* (2006.01)
*H03M 13/43* (2006.01)
*H03M 13/39* (2006.01)

(52) U.S. Cl.
CPC ....... *H03M 13/3746* (2013.01); *H03M 13/11* (2013.01); *H03M 13/39* (2013.01); *H03M 13/43* (2013.01)

(58) Field of Classification Search
CPC .. H03M 13/3746; H03M 13/39; H03M 13/11; H03M 13/43
See application file for complete search history.

(56) References Cited

U.S. PATENT DOCUMENTS

| | | |
|---|---|---|
| 6,647,462 B1 | 11/2003 | Miretsky et al. |
| 8,140,948 B2 | 3/2012 | Yue et al. |
| 8,352,827 B2 | 1/2013 | Gong et al. |
| 8,782,487 B2 * | 7/2014 | Yang ............ G11B 20/1833 714/746 |

(Continued)

FOREIGN PATENT DOCUMENTS

| | | |
|---|---|---|
| CN | 103281090 A | 9/2013 |
| WO | 2015139160 A1 | 9/2015 |

OTHER PUBLICATIONS

C. Adnan Aslam, Y. L. Guan and K. Cai, "Edge-Based Dynamic Scheduling for Belief-Propagation Decoding of LDPC and RS Codes," in IEEE Transactions on Communications, vol. 65, No. 2, pp. 525-535, Feb. 2017 (Year: 2017).*

(Continued)

*Primary Examiner* — Cynthia Britt
(74) *Attorney, Agent, or Firm* — Kligler & Associates

(57) ABSTRACT

A decoder includes multiple variable-node circuits and logic circuitry. The variable-node circuits hold variables of an Error Correction Code (ECC), defined by a set of check equations over multiple variables corresponding to the variable-node circuits. The logic circuitry is configured to receive a code word encoded using the ECC, to hold, prior to decoding in a sequence of iterations, a scheduling scheme that specifies, for each iteration, whether each of the variable-node circuits is to be processed or skipped in that iteration, to perform the iterations in the sequence, including selecting for processing, in each iteration, only variable-node circuits specified for processing in that iteration, to determine for each selected variable-node circuit, a count of unsatisfied check equations in which the respective variable participates, and to make a decision on flipping a binary value of the variable based on the count and apply the decision by the respective variable-node circuit.

16 Claims, 3 Drawing Sheets

(56) References Cited

U.S. PATENT DOCUMENTS

| | | | |
|---|---|---|---|
| 9,258,015 | B2 | 2/2016 | Ish-Shalom et al. |
| 9,755,665 | B1* | 9/2017 | Chilappagari ..... H03M 13/1105 |
| 2006/0061498 | A1 | 3/2006 | Lamy |
| 2008/0148128 | A1 | 6/2008 | Sharon et al. |
| 2008/0256264 | A1 | 10/2008 | Muto et al. |
| 2010/0262813 | A1 | 10/2010 | Brown et al. |
| 2011/0246862 | A1 | 10/2011 | Graef |
| 2012/0106683 | A1 | 5/2012 | Zhao |
| 2015/0381206 | A1* | 12/2015 | Fainzilber .......... H03M 13/1108 714/758 |
| 2017/0117925 | A1* | 4/2017 | Achtenberg ........ G06F 11/1072 |
| 2017/0272102 | A1* | 9/2017 | Goldenberg ........ G06F 11/1012 |

OTHER PUBLICATIONS

Eric Psota and Lance C. Pérez, "The Manifestation of Stopping Sets and Absorbing Sets as Deviations on the Computation Trees of LDPC Codes," Journal of Electrical and Computer Engineering, vol. 2010, Article ID 432495, 17 pages, 2010. https://doi.org/10.1155/2010/432495 (Year: 2010).*

Beermann et al.,"A Generalization of Residual Belief Propagation for Flexible Reduced Complexity LDPC Decoding", Institute of Communication Systems and Data Processing , 5 pages, Sep. 2011.

Sharon et al., "An Efficient Message-Passing Schedule for LDPC Decoding", Proceedings of 23rd IEEE Convention of Electrical and Electronics Engineers in Israel, pp. 1-4, Sep. 2004.

Sharon et al., "Convergence Analysis of Serial Message-Passing Schedules for LDPC Decoding", 4th International Symposium on Turbo Codes & Related Topics; 6th International ITG—Conference on Source and Channel Coding, pp. 1-6, Apr. 3-7, 2006.

Sharon et al., "Efficient Serial Message-Passing Schedules for LDPC Decoding", IEEE Transactions on Information Theory, vol. 53, No. 11, pp. 4076-4091, Nov. 2007.

Radosavljevic et al., "Optimized Message Passing Schedules for LDPC Decoding", Conference Record of the Thirty-Ninth Asilomar Conference on Signals, Systems and Computers, pp. 591-595, Oct. 30-Nov. 2, 2005.

* cited by examiner

EFFICIENT LDPC DECODING WITH PREDEFINED ITERATION-DEPENDENT SCHEDULING SCHEME

TECHNICAL FIELD

Embodiments described herein relate generally to Error Correction Coding (ECC), and particularly to methods and systems for ECC decoding.

BACKGROUND

Some types of error correction codes, such as Low Density Parity Check (LDPC) codes, are commonly decoded using iterative decoding processes. The intra-order of operations that are performed during decoding iterations is referred to as scheduling.

Various scheduling schemes and configurations for iterative decoding are known in the art. For example, U.S. Pat. No. 8,140,948 describes a decoder and method for iteratively decoding of low-density parity check codes (LDPC) that includes, in a code graph, performing check node decoding by determining messages from check nodes to variable nodes. In the code graph, variable node decoding is performed by determining messages from the variable nodes to the check nodes. The variable node decoding is independent from degree information regarding the variable nodes.

U.S. Pat. No. 9,258,015 describes a method that includes decoding a code word of an Error Correction Code (ECC), which is representable by a set of check equations, by performing a sequence of iterations, such that each iteration involves processing of multiple variable nodes. For one or more selected variable nodes, a count of the check equations that are defined over one or more variables held respectively by the one or more selected variable nodes is evaluated, and, when the count meets a predefined skipping criterion, the one or more selected variable nodes are omitted from a given iteration in the sequence.

SUMMARY

An embodiment that is described herein provides a decoder that includes multiple variable-node circuits and logic circuitry. The multiple variable-node circuits hold respective variables of an Error Correction Code (ECC) that is representable by a set of check equations over multiple variables corresponding respectively to the variable-node circuits. The logic circuitry is configured to receive for decoding a code word that was encoded using the ECC, to hold, prior to iterative decoding of the ECC in a sequence of iterations, a scheduling scheme that specifies, for each iteration in the sequence, whether each of the variable-node circuits is to be processed or skipped in that iteration, to decode the received code word by performing the iterations in the sequence, including selecting for processing, in each of the iterations, only variable-node circuits that are specified for processing in the respective iteration, by the scheduling scheme, to determine for each selected variable-node circuit, a count of unsatisfied check equations in which the respective variable participates, and to make a decision whether or not to flip a binary value of the respective variable based on the count, and apply the decision by the respective variable-node circuit.

In some embodiments, the ECC includes an irregular Low-Density Parity-Check (LDPC) code, in which at least a first variable and a second variable among the multiple variables of the ECC participate in different respective first and second numbers of the check equations. In other embodiments, the scheduling scheme assigns to a given iteration in the sequence a respective predefined flipping threshold, and the logic circuitry is configured, when processing a given variable-node circuit in the given iteration, to flip the binary value of the respective variable when the count of the given variable-node circuit exceeds the flipping threshold assigned to the given iteration. In yet other embodiments, the scheduling scheme specifies that a variable-node circuit in a given iteration is to be skipped when the flipping threshold assigned to the given iteration is larger than a number of check equations in which the respective variable participates.

In an embodiment, the scheduling scheme assigns to successive iterations in the sequence respective numerical flipping thresholds that form a non-increasing sequence. In another embodiment, for each iteration in the sequence, the scheduling scheme assigns multiple different flipping thresholds to multiple respective variable-node circuits whose variables appear in different respective numbers of check-equations.

In some embodiments, the variable-node circuits are partitioned into groups so that at least one of the groups includes multiple variable-node circuits, the scheduling scheme specifies processing or skipping the variable-node circuits at a group level, and the logic circuitry is configured to process or skip an entire group of variable-node circuits in accordance with the scheduling scheme. In other embodiments, the logic circuitry is configured to stop decoding when all of the check equations are satisfied or when a number of processed iterations exceeds a predefined maximal number.

There is additionally provided, in accordance with an embodiment that is described herein, a method for decoding, including, in a decoder that includes multiple variable-node circuits that hold respective variables of an Error Correction Code (ECC) that is representable by a set of check equations over multiple variables corresponding respectively to the variable-node circuits, receiving for decoding a code word that was encoded using the ECC. Prior to iterative decoding of the ECC in a sequence of iterations, a scheduling scheme that specifies, for each iteration in the sequence, whether each of the variable-node circuits is to be processed or skipped in that iteration, is held. The received code word is decoded by performing the iterations in the sequence, including selecting for processing, in each of the iterations, only variable-node circuits that are specified for processing in the respective iteration, by the scheduling scheme. For each selected variable-node circuit, a count of unsatisfied check equations in which the respective variable participates is determined, and a decision whether or not to flip a binary value of the respective variable is made based on the count, and the decision is applied by the respective variable-node circuit.

These and other embodiments will be more fully understood from the following detailed description of the embodiments thereof, taken together with the drawings in which:

DETAILED DESCRIPTION OF EMBODIMENTS

Overview

Figure 1:
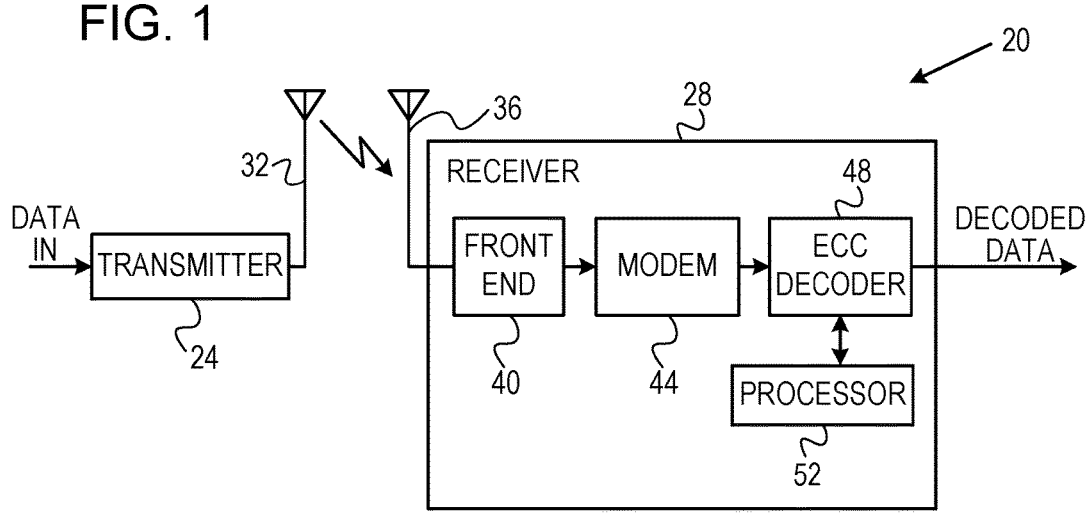
FIG. 1 is a block diagram that schematically illustrates a communication system that uses Error Correction Coding (ECC), in accordance with an embodiment that is described herein.

Some types of ECC, such as Low Density Parity Check (LDPC) codes, are represented by multiple check equations that are defined over multiple variables. Some iterative ECC decoders may be represented using multiple check nodes corresponding to the check equations, and multiple variable nodes corresponding to the variables. In this representation, the variable corresponding to a given variable node is connected to the check nodes that correspond to the check equations in which the variable appears.

A decoder of this sort, i.e., a message passing decoder, decodes the ECC by exchanging messages between check nodes and variable nodes that are connected to one another, in an attempt to converge to a state in which the variables corresponding to the variable nodes hold a valid code word of the ECC. The decoder converges to a valid code word when all the check equations representing the ECC are satisfied by the current values of the variables. The number of check equations in which a given variable appears is also referred to as the degree of that variable. Prior to decoding convergence, it is possible that for a given variable, only a partial subset of the check equations in which that variable appears are satisfied.

The variable nodes and check nodes can be implemented in hardware, in which case a variable node may comprise a variable-node circuitry comprising a storage element for storing the value of the respective variable, and logic for communicating with relevant check nodes and for applying to the respective variable operations such as conditional bit-flipping.

In some decoding processes, the message sent from a given check node to a given variable node comprises a predefined function that is computed over the most updated messages received at the given check node from the other variable nodes, e.g., during the most recent decoding iteration. In the context of the present disclosure and in the claims, the term iteration refers to a scan over the entire check nodes and variable nodes, wherein one or more of the scanned variable nodes may be skipped. For example, a check node message may comprise an indication of whether the check equation corresponding to this check node is satisfied. (In the description that follows, for the sake of brevity, we sometimes refer to a variable node rather than to the variable corresponding to the node.)

Embodiments that are described herein provide improved methods and systems for scheduling the computations carried out by the check and variable nodes during the decoding iterations. In the context of the present disclosure, the term "scheduling" refers to the scanning order of the check and variable nodes. In the presented embodiments, scheduling of the variable nodes mainly refer to "serial V" scheduling, in which the variable nodes (or groups thereof) are scanned sequentially. In the disclosed embodiments, however, instead of scanning all of the variable nodes, certain variable nodes, or groups of variable nodes, may be omitted from a given iteration (i.e., skipping the computations for that variable node, or nodes). By processing only a partial subset of the entire variable nodes in one or more of the iterations, the decoding latency and power consumption reduce considerably.

In some disclosed embodiments, the scheduling is predefined per iteration, for a sequence of iterations, prior to decoding. The decoder holds a scheduling scheme for iterative decoding of the ECC, prior to actually performing the iterations in the sequence. The scheduling scheme specifies, for each iteration in the sequence, whether each of the variable nodes is to be processed or skipped in that iteration. The scheduling scheme is independent of any particular input for decoding. During decoding, the decoder selects for processing, in each of the iterations, only variable nodes that are specified for processing in the respective iteration, by the scheduling scheme.

Consider a binary LDPC code whose variables can be set to only two predefined values, e.g., '1' and '0'. An iterative decoder for the binary LDPC code comprises variable nodes that hold binary variables. In some embodiments, the decoder applies a suitable bit-flipping decoding method. For example, when scanning a variable node as part of a certain iteration in the sequence, the decoder flips the binary value of the respective variable in accordance with a suitable flipping criterion. Flipping a binary value means modifying a binary value from '1' to '0' or vice versa.

In some embodiments, the decoder holds, for each iteration in the sequence, a predefined flipping threshold, and flips in a given iteration only variable nodes for which the number of unsatisfied check equations is equal to or greater than the respective flipping threshold. In other embodiments, variable nodes having different degrees may be assigned different flipping thresholds within the same iteration. In such embodiments, the decision of flipping a variable node in a given iteration is based on the flipping threshold assigned to that variable node in the given iteration.

In some embodiments, the ECC comprises an irregular LDPC code, i.e., an LDPC code whose variables do not all have the same degree. Consider, for example, an irregular LDPC code for which a majority of the variables have a degree $Vd=4$ (i.e., each variable appears in four check equations) and the remaining variables have a degree $Vd=8$ (i.e., each variable appears in eight check equations). In the present example, for the sake of simplicity, we assume assigning a single flipping threshold that applies to all of the variable nodes scanned in each iteration.

Note that the number of unsatisfied check equations for a variable of degree $Vd=4$ cannot exceed four. In this example, in all of the iterations for which the flipping threshold is set above four, the processing of all the variables participating in four check equations can be omitted in the scheduling scheme, without affecting the decoding performance. This approach reduces decoding latency and power consumption considerably. Designing an efficient scheduling scheme based on the flipping thresholds is applicable similarly to any other suitable irregular LDPC code.

Since the reliability of a variable typically degrades with the number of unsatisfied check equations in which the variable appears, it makes sense to flip such variables with a higher priority. In some embodiments, the flipping thresholds specified respectively for a sequence of iterations, form a decreasing sequence or a non-increasing sequence, which results in flipping variable nodes in increasing order of reliability (i.e., flip less reliable variables first.) When flipping thresholds assigned to different variable nodes may differ, the threshold sequence of each variable node forms a non-increasing sequence over the iterations.

Iterative decoders based on a scheduling scheme, as described above, are relatively simple to implement. Specifying to process or skip a variable node requires only one bit of information per variable node per iteration. In addition, a hardware circuit designed to omit the processing of variable nodes based on a scheduling scheme typically has very low complexity and latency.

In the disclosed techniques an iterative decoder processes or skips variable nodes over a sequence of iterations based on a scheduling scheme defined prior to decoding. The scheduling scheme is designed to skip certain variable nodes without any compromise to the overall decoding performance such as Bit Error Rate (BER) for given operating conditions, e.g., Signal to Noise Ratio (SNR). The disclosed techniques are advantageous in terms of implementation complexity, decoding latency and power consumption.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
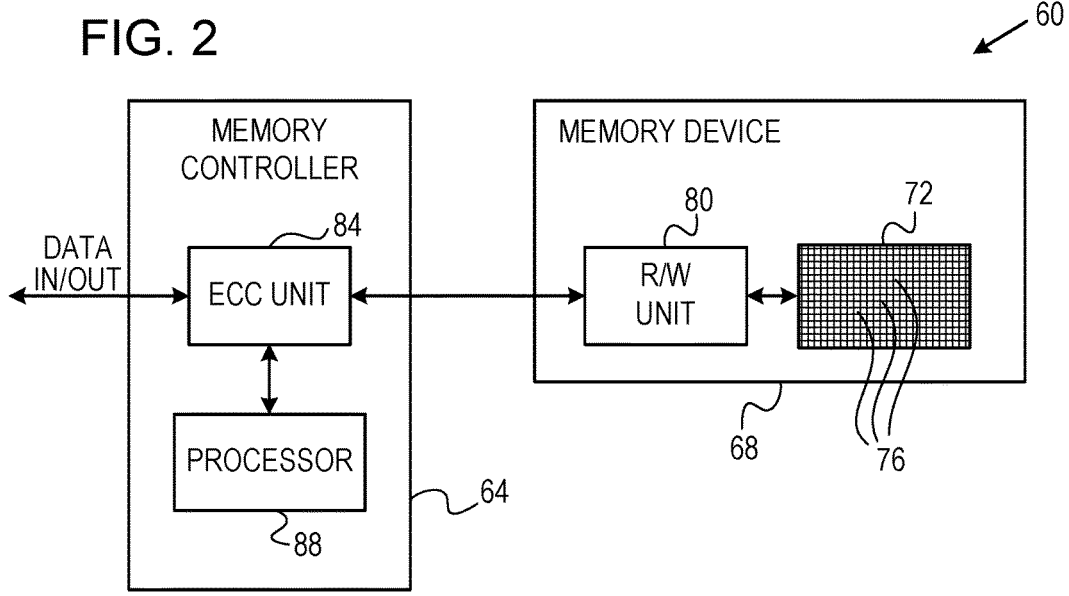
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Low Density Parity Check (LDPC) code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Figure 3:
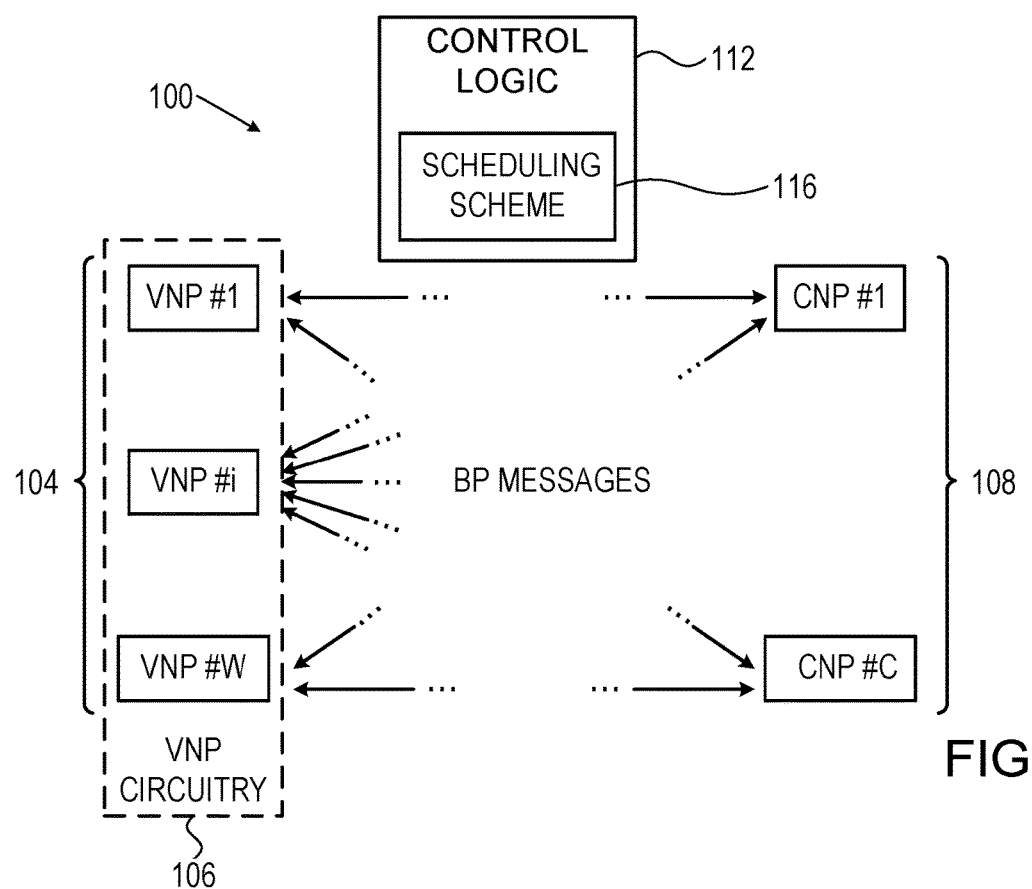
FIG. 3 is a block diagram that schematically illustrates an iterative LDPC decoder with predefined scheduling, in accordance with an embodiment that is described herein.

FIG. 3 is a block diagram that schematically illustrates an iterative LDPC decoder 100 with predefined scheduling, in accordance with an embodiment that is described herein. Decoder 100 can be used to implement decoder 48 of FIG. 1 above, or ECC unit 84 of FIG. 2 above. Decoder 100 accepts as input valid ECC code words, or other input that comprises corrupted code words (e.g., by noise) and therefore contain errors. In other words, the input to the decoder may not always comprise valid code words of the ECC. In the description that follows, the input to the decoder is also referred to as the channel output. The ECC decoder decodes the input while attempting to correct these errors, so as to reconstruct the data conveyed in the code words. In a typical implementation, each code word comprises on the order of several hundred to several thousand bits, although any other suitable code word size can be used.

The LDPC code in question is defined by a set of M check equations, which are defined over a set of V variables (e.g., bits for a binary LDPC code). Decoder 100 comprises a set of W Variable Node Processors (VNPs) 104 denoted VNP#1 ... VNP#W, and a set of C Check Node Processors (CNPs) 108 denoted CNP#1 ... CNP#C. Each variable node may be associated with a respective VNP, and each check equation may be associated with a respective CNP. In the figure, VNP#1 ... VNP#N are collectively referred to as "VNP circuitry" 106.

VNPs 104 and CNPs 108 are connected by arcs (shown as arrows in the figure, in accordance with the structure of the underlying code. The VNP assigned to each variable (or variable node) is connected to the CNPs that are assigned to the check equations (or check node) in which that variable appears. Since the LDPC code is sparse (i.e., the code has a sparse parity check matrix), each CNP is typically connected only to a small subset of the VNPs. In other words, only a small number of variables appear in each of the check equations. As long as the decoder has not yet converged to a valid code word, at least one check equation is still unsatisfied. The number of check equations in which a given variable appears (i.e., the number of arcs connected to the respective variable node for that variable) is referred to as the degree of that variable.

LDPC codes may be classified as regular or irregular codes. The variables of a regular LDPC code all share the same degree. In irregular LDPC codes, at least two of the variables have different respective degrees. The decoding scheduling in the embodiments disclosed herein is demonstrated to be efficient for irregular LDPC codes.

The description that follows refers mainly to binary LDPC codes, in which case the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, VNPs 104 are initialized with the respective bit values of the channel output. The VNPs and CNPs exchange messages with one another over the arcs that connect them. Based on the messages received from the CNPs and on the channel output, VNPs may adapt their bit values. This scheme is sometimes referred to as Belief Propagation (BP), and the messages exchanged between the VNPs and CNPs are sometimes referred to as BP messages. The messages from the CNPs to the VNPs are referred to herein as CNP messages, and the messages from the VNPs to the CNPs are referred to herein as VNP messages.

Decoder 100 further comprises a control logic unit 112 that manages and coordinates the operations carried out by the VNPs and CNPs. For example, among other tasks, control logic 112 manages the scheduling of the variable and check nodes. In some embodiments, control logic comprises a scheduling scheme 116 that defines scheduling for a sequence of decoding iterations, by specifying for each iteration in the sequence, whether each of the variable nodes is to be processed or skipped in that iteration. Considerations for designing an efficient scheduling scheme will be addressed below.

Scheduling scheme 116 can be implemented in any suitable manner such as storing the scheduling information in a memory of any suitable storage technology. Such a memory may comprise a nonvolatile memory, e.g., a Read Only Memory (ROM), or a Flash memory. Alternatively, the memory that stores the scheduling scheme comprises a Random Access Memory (RAM), which is loaded with the scheduling scheme before decoding. In yet other embodiments, the scheduling scheme may be stored using hardware circuitry such as using registers, fuses, or any other suitable hardware elements.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, ECC unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, ECC unit 84 and/or decoder 100 (including VNPs 104, CNPs 108, and control logic 112) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

In the context of the present patent application and in the claims, the term "logic circuitry" collectively refers to VNPs 104, CNPs 108, and control logic 112 (including scheduling scheme 116.)

In some embodiments, VNPs 104 and CNPs 108 are implemented in hardware, in which case a variable node associated with a VNP comprises a variable-node circuitry comprising a suitable storage element for storing the value of the respective variable, as well as logic for communicating with check nodes in relevant CNPs and for applying to the respective variable operations such as conditional bit-flipping.

Check and Variable Nodes Operation and Scheduling

In the description that follows, control logic 112 of decoder 100 manages the scheduling or scanning order of the variable and check nodes, using scheduling scheme 116. In the present example, an outer loop scans the variable nodes and an inner loop scans the check nodes connected to each scanned variable node. (This scheduling order is sometimes referred to as "serial V" or "column-layered".

In some embodiments, the variables of the ECC are partitioned into groups that are referred to as variable layers, or simply layers for brevity. A layer may comprise, for example, several tens of variables, e.g., 128 variables per layer. The variables in a given variable layer may be processed in any suitable order. For example, independent variables may be processed concurrently, or in any desired order, since they are independent of one another. The term "independent variables" in this context means that they do not appear together in any check equation. A group of variables is said to be independent if every pair of variables in the group is independent. The variable layers are typically processed sequentially, since variables in different layers may depend on one another.

In some embodiments, scheduling scheme 116 is defined at a layer granularity. In such embodiments, scheduling scheme 116 specifies processing or skipping all of the variables of the variable layer to which they belong. In such embodiments, the control logic skips together the entire variables of a layer.

In some embodiments, the iterative decoding process scans variable and check nodes, or groups thereof sequentially in some scheduling order. A full scan over the variable and check nodes is referred to herein as a decoding iteration, or simply "iteration" for brevity. An example of an iterative process of this sort is described in the paper by Cui et al., in "Efficient Decoder Design for High-Throughput LDPC decoding," IEEE Asia Pacific Conference on Circuits and Systems, November, 2008, which is incorporated herein by reference. Alternatively, any other suitable process can be used.

Based on the code structure and decoding scheduling, each CNP sends messages to its connected VNPs and receives messages from its connected VNPs. The message value sent from a given CNP to a given VNP comprises a predefined CNP function computed over the respective CNP state and the VNP messages received by that CNP.

CNPs 108 can use any suitable function to compute the message value to be sent to each of its connected VNPs. When decoder 100 is configured to extrinsic message passing decoding, the CNP function may comprise, for example the "product-sum" or "min-sum" function, or approximations thereof. When decoder 100 is configured to perform bit flipping decoding, the CNPs function comprises a parity-check sum function (also referred to as a syndrome calculation function), which is related to the check equations. When decoder 100 is configured to a-posteriori message passing decoding, the CNP messages sent to a given variable node may be computed as a function of the messages received from that variable node.

Similarly, when the turn of each variable node arrives, the respective VNP receives messages from its connected CNPs and sends to these CNPs updated messages. The message value sent from a given VNP to a given CNP comprises a predefined VNP function computed over the incoming CNP messages and the VNP state. The set of messages typically comprises the most updated messages received in the given VNP from the CNPs other than the given CNP, e.g., during the most recent decoding iteration.

VNPs 104 can use any suitable VNP function for calculating the message value to be sent to its connected CNPs. In some embodiments, decoder 100 comprises an extrinsic message passing decoder, and the VNP function comprises, for example, the summation of all the incoming messages sent from the target check node. In alternative embodiments, decoder 100 comprises an a-posteriori message passing decoder, and the VNP function computes, for example, the summation of all the incoming messages. In further alternative embodiments, decoder 100 comprises a bit flipping decoder, and the VNP function comprises evaluating the VNP bit value, for example, by conditionally flipping the bit value based on the number of the unsatisfied check equations in which the bit value appears.

Upon receiving a new message from a given VNP, the CNP typically replaces the previous message received from this VNP, and re-evaluates its state to reflect the newly-received message. VNPs update similarly upon receiving the CNPs messages.

Designing Efficient Scheduling for Bit-Flipping Decoding of Irregular LDPC Codes In iterative decoding of a LDPC code using bit-flipping, the decoder typically scans all the variables in each iteration, and decides whether or not to flip the bit value of a scanned variable based on some flipping criterion. When all the check equations are satisfied, the variables are assumed to hold a valid code word, and the iterative decoding terminates.

Consider, for example, a variable participating in a number of $V_d$ check equations. When the number of unsatisfied equations in which the variable appears is larger than a flipping threshold $T=CEIL(V_d/2)$, the respective bit value is likely to be erroneous. In another embodiment, the flipping threshold $T$ is set in the range $T>CEIL(V_d/2)$. Flipping the bit-value of a variable that appears in a given check equation opposites the state of this check equation from 'unsatisfied' to 'satisfied,' and vice versa. Therefore, an embodiment in which bit-flipping is performed using the above flipping criteria results in reducing the number of unsatisfied equations.

In some embodiments, the reliability of a variable is evaluated in terms of the number of the unsatisfied equations in which this variable appears. A variable that appears in $V_d$ check equations is considered most reliable when all of these $V_d$ check equations are satisfied, and least reliable when all of these $V_d$ check equations are unsatisfied. In general, the reliability of a variable is typically a non-increasing function of the number of unsatisfied check equations in which the variable appears.

In some embodiments, the decoder holds a predefined flipping threshold per iteration. In such embodiments, when scanning a variable node in a given iteration, the decoder flips the respective bit value when the number of unsatisfied equations in which the respective variable appears is equal to or larger than the flipping threshold assigned to that iteration. In an embodiment, the decoder holds multiple predefined flipping thresholds to be used respectively in a sequence of iterations. The flipping thresholds are determined prior to decoding an input code word and remain unchanged during the entire sequence of iterations. The flipping threshold value applies to all the variable nodes (or variables). In alternative embodiments, the decoder holds, per iteration, multiple respective flipping thresholds for variable nodes of different degrees. In a given iteration, the decoder decides on flipping a variable node based on the respective flipping threshold assigned to the variable node in the given iteration.

Next we describe a method for designing a scheduling scheme that results in efficient decoding of an irregular LDPC code.

Consider an irregular LDPC code defined by $C_n$ check equations over $V_n$ variables, wherein the $V_n$ variables are partitioned into subgroups denoted V1 and V2, respectively. In the present example, the variables in the subgroups V1 and V2 have respective degrees $Vd1=8$ and $Vd2=4$. In the present example, V1 comprises 30% of the $V_n$ variables, whereas V2 comprises 70% of the $V_n$ variables.

Consider an iterative bit-flipping decoder for the example irregular LDPC code. In an embodiment, the logic control unit of the decoder decides on actual bit-flipping using iteration-specific bit-flipping thresholds that form a non-increasing sequence. An example such flipping thresholds are depicted in Table 1.

TABLE 1

| Bit-flipping threshold as a function of iteration index | | | | | | | | | | |
|---|---|---|---|---|---|---|---|---|---|---|
| Iteration | 1 | 2 | 3 | 4 | 5 | 6 | 7 | 8 | 9 | 10 |
| BF Threshold | 8 | 7 | 6 | 5 | 5 | 4 | 4 | 3 | 2 | 1 |

In the present example, in the first iteration, the decoder flips the bit-values of variables that appear in eight unsatisfied check equations. In the second iteration, the decoder flips the bit-values of variables that appear in seven or eight unsatisfied equations, and so on. In the example of Table 1, each of bit-flipping thresholds 5 and 4 is used in two consecutive iterations.

Note that in the present example, during the first iterations 1-5, the variables having $Vd=4$ can never have more than four unsatisfied check equations, because these variables only appear in four check equations. Consequently, the processing of all of the variables in subgroup V2 can be skipped, in iterations 1-5, without degrading the decoding performance. The scheduling scheme in this example is depicted in Table 2.

TABLE 2

| Example scheduling scheme | | | | | | | | | | |
|---|---|---|---|---|---|---|---|---|---|---|
| Iteration | 1 | 2 | 3 | 4 | 5 | 6 | 7 | 8 | 9 | 10 |
| Variables vd1 = 8 (30%) | P | P | P | P | P | P | P | P | P | P |
| Variables vd1 = 4 (70%) | S | S | S | S | S | P | P | P | P | P |

In Table 2, the symbols 'P' and 'S' denote process and skip, respectively. As seen in Table 2, over the first five iterations only 30% of the variable nodes are actually processed, whereas 70% of the variable nodes are skipped, resulting in a considerable reduction in decoding latency and power consumption. In this example, let Tp denote the processing time of a variable node. In a naïve approach, performing 10 decoding iterations without skipping any of the variable nodes would take 10·Tp·Vn time units. In the present example, however, the decoding using the disclosed techniques takes only 5·Tp·(0.7·Vn)+10·Tp·(0.3·Vn)=6.5·Tp·Vn time units, i.e., a reduction of 35% in decoding time compared to the naïve scheme, without compromising the decoding performance.

In the example above, the sequence of bit-flipping thresholds forms a non-increasing sequence over the decoding iterations. In alternative embodiments other suitable sequences of bit-flipping thresholds that do not necessarily form a non-increasing sequence can also be used. Using a non-increasing sequence of bit-flipping thresholds, however, may be advantageous over other sequences in terms of fast decoding convergence (requiring a small number of iterations) to a valid code word.

The irregular LDPC code and scheduling scheme above were given by way of example. The disclosed techniques are applicable to other suitable LDPC codes and scheduling schemes. For example, the LDPC code may comprise variables partitioned into more than two variable degree values.

Iterative Decoding Using a Scheduling Scheme

Figure 4:
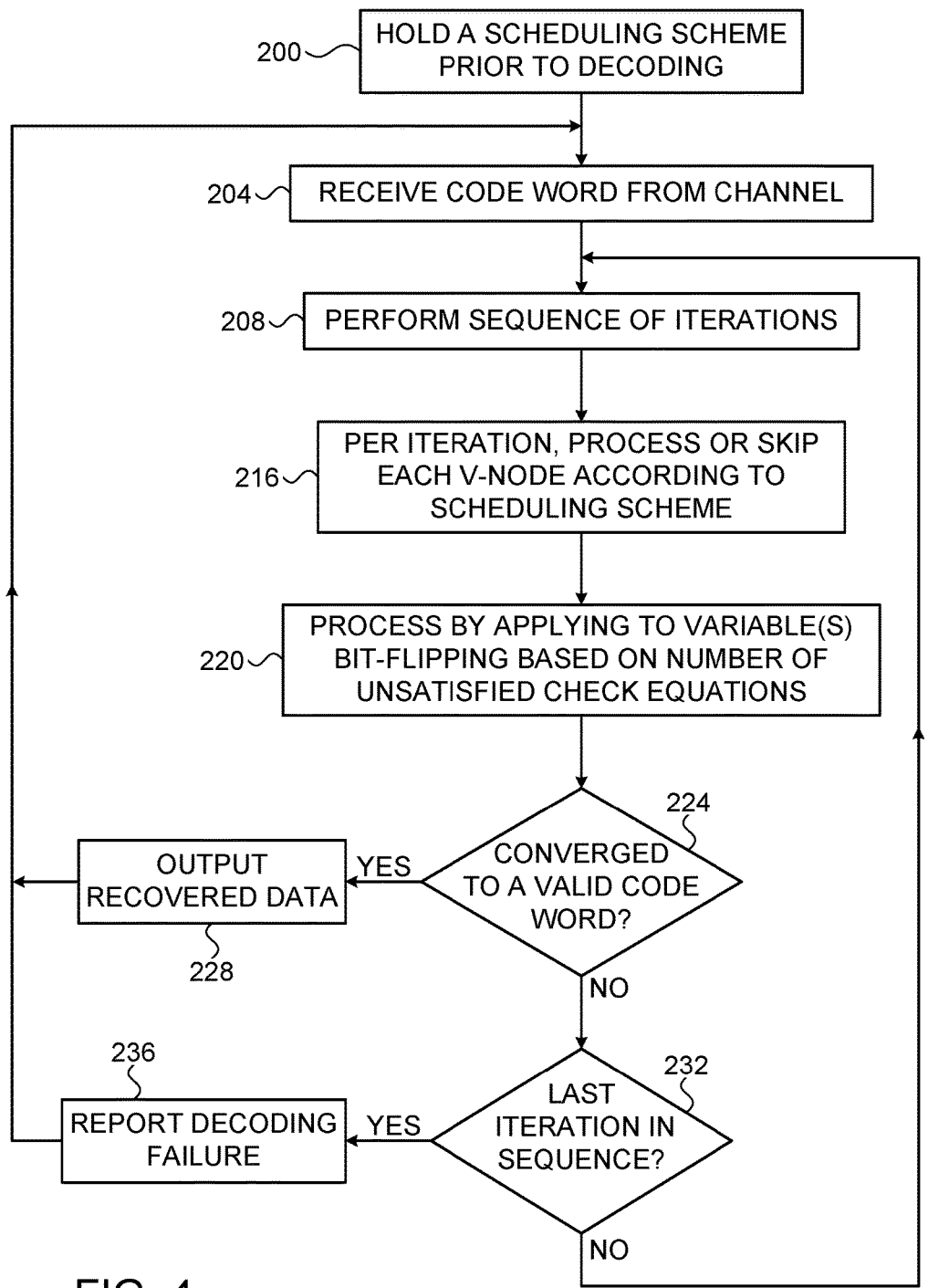
FIG. 4 is a flow chart that schematically illustrates a method for iterative decoding using a scheduling scheme, in accordance with an embodiment that is described herein.

FIG. 4 is a flow chart that schematically illustrates a method for iterative decoding using a scheduling scheme, in accordance with an embodiment that is described herein. The method is applicable for both variable nodes and variable layers. In FIG. 4, v-node denotes a variable node or a group of variable nodes, such as processed by VNP 104, to which the scheduling has arrived. In some embodiments, the processing among the VNPs is performed in parallel. In the description that follows, we use the terms v-node, and variable interchangeably. In the method of FIG. 4, the decision to process or skip a v-node is carried out by control logic 112, based on scheduling scheme 116.

The method will be described as being executed by decoder 100 of FIG. 3 above. In this example we assume that each VNP 104 handles one or more variables. In some embodiments, the variables processed by a single VNP share a common degree.

The method begins with the decoder holding a predefined scheduling scheme at a scheduling definition step 200. In some embodiments, the scheduling scheme is defined over a sequence of N iterations, wherein for each iteration index $1 \leq n \leq N$ the scheduling scheme specifies whether each of the v-nodes is to be processed or skipped in that iteration. Note that such a scheduling scheme requires storing only one bit for each v-node per iteration. In other embodiments, e.g., embodiments that employ a non-increasing sequence of flipping thresholds, the scheduling scheme may store one bit per v-node or one bit per layer of v-nodes to indicate skipping up to a predefined iteration number. The predefined iteration numbers in which the skipping pattern changes are also stored as part of the scheduling scheme.

At a reception step 204, the decoder receives a code word to be decoded from a channel. For example, the decoder receives the code word from modem 44 in FIG. 1, or from R/W unit 80 of FIG. 2. In the description that follows we assume that the output of the channel is binary, i.e., comprises a vector of bits. The code word received may contain one or more erroneous bits.

At an iteration loop step 208, control logic 112 performs a sequence of decoding iterations, up to a predefined number N of iterations. At a processing step 216, the control logic processes or skips each of the v-nodes, as specified by the scheduling scheme for that iteration.

At a processing step 220, each v-node that is scheduled for processing by the scheduling scheme, processes its variable node(s) using a suitable bit-flipping method, using a respective VNP 104. For example, the v-node flips a variable that appears in a number of unsatisfied check equations larger than a predefined flipping threshold, as described above. In some embodiments, the flipping thresholds for the respective N iterations are stored as part of the scheduling scheme. When the v-node comprises multiple variables the v-node may process these variables in any suitable order, e.g., sequentially. Alternatively, the v-node may process multiple variables in parallel.

In terms of the VNPs and CNPs of FIG. 3, at step 220, VNP 104 receives CNP messages from its connected CNPs and calculates and sends respective VNP messages to its connected CNPs. In the present example we assume that each CNP message comprises an indication of whether the check equation that is associated with this CNP is satisfied. VNP 104 thus evaluates for the currently scanned v-node the number of unsatisfied check equations among its associated check nodes. When VNP 104 processes a group of multiple v-nodes, the VNP evaluates the number of unsatisfied check equations for each v-node in the group (and for each variable node in a v-node comprising multiple variable nodes).

After processing all the v-nodes specified by the scheduling scheme for the current iteration, the control logic checks whether the decoding converged to a valid code word, at a convergence checking step 224. In an embodiment, the control logic detects convergence when all of the check equations representing the ECC are satisfied. In response to detecting convergence, the decoder outputs the valid code word (or only the data part of the code word), at an output step 228, and loops back to step 204 to receive subsequent code words for decoding. Otherwise, the controller checks whether the last iteration was processed, at a termination step 232. If the control logic detects at step 232 that all N iterations have been processed, the control logic outputs a decoding failure indication, at a failure reporting step 236, and loops back to step 204 to receive subsequent code words for decoding. Otherwise, the control logic loops back to step 208 to perform an additional decoding iteration.

The embodiments described above are given by way of example, and other suitable embodiments can also be used. For example, although the embodiments above mainly refer to a message-passing decoder, other suitable iterative decoding methods can also be used. As another example, any suitable variant bit-flipping method other than those described above can also be used. For example, the disclosed embodiments are applicable to the Gallager-B decoding method.

The embodiments described above refer mainly to a scheduling scheme that is independent of the channel conditions. In alternative embodiments, the scheduling scheme comprises multiple sub-schemes, each sub-scheme specifies the variable nodes to process/skip per iteration, and each sub-scheme corresponds to different operating conditions such as SNR.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decoder, comprising:
multiple variable-node circuits holding respective variables of an Error Correction Code (ECC) that is representable by a set of check equations over multiple variables corresponding respectively to the variable-node circuits; and
logic circuitry, which is configured to:
receive for decoding a code word that was encoded using the ECC;
prior to iterative decoding of the ECC in a sequence of iterations, hold a scheduling scheme that specifies, for each iteration in the sequence, whether each of the variable-node circuits is to be processed or skipped in that iteration;
decode the received code word by performing the iterations in the sequence, including selecting for processing, in each of the iterations, only variable-node circuits that are specified for processing in the respective iteration, by the scheduling scheme;
for each selected variable-node circuit, determine a count of unsatisfied check equations in which the respective variable participates; and
make a decision whether or not to flip a binary value of the respective variable, based on the count, and apply the decision by the respective variable-node circuit.

2. The decoder according to claim 1, wherein the ECC comprises an irregular Low-Density Parity-Check (LDPC) code, in which at least a first variable and a second variable among the multiple variables of the ECC participate in different respective first and second numbers of the check equations.

3. The decoder according to claim 1, wherein the scheduling scheme assigns to a given iteration in the sequence a respective predefined flipping threshold, wherein the logic circuitry is configured, when processing a given variable-node circuit in the given iteration, to flip the binary value of the respective variable when the count of the given variable-node circuit exceeds the flipping threshold assigned to the given iteration.

4. The decoder according to claim 3, wherein the scheduling scheme specifies that a variable-node circuit in a given iteration is to be skipped when the flipping threshold assigned to the given iteration is larger than a number of check equations in which the respective variable participates.

5. The decoder according to claim 3, wherein the scheduling scheme assigns to successive iterations in the sequence respective numerical flipping thresholds that form a non-increasing sequence.

6. The decoder according to claim 3, wherein for each iteration in the sequence, the scheduling scheme assigns multiple different flipping thresholds to multiple respective variable-node circuits whose variables appear in different respective numbers of check-equations.

7. The decoder according to claim 1, wherein the variable-node circuits are partitioned into groups so that at least one of the groups comprises multiple variable-node circuits, wherein the scheduling scheme specifies processing or skipping the variable-node circuits at a group level, and wherein the logic circuitry is configured to process or skip an entire group of variable-node circuits in accordance with the scheduling scheme.

8. The decoder according to claim 1, wherein the logic circuitry is configured to stop decoding when all of the check equations are satisfied or when a number of processed iterations exceeds a predefined maximal number.

9. A method for decoding, comprising:
in a decoder that comprises multiple variable-node circuits that hold respective variables of an Error Correction Code (ECC) that is representable by a set of check equations over multiple variables corresponding respectively to the variable-node circuits, receiving for decoding a code word that was encoded using the ECC;
prior to iterative decoding of the ECC in a sequence of iterations, holding a scheduling scheme that specifies, for each iteration in the sequence, whether each of the variable-node circuits is to be processed or skipped in that iteration;
decoding the received code word by performing the iterations in the sequence, including selecting for processing, in each of the iterations, only variable-node circuits that are specified for processing in the respective iteration, by the scheduling scheme;
for each selected variable-node circuit, determining a count of unsatisfied check equations in which the respective variable participates; and
making a decision whether or not to flip a binary value of the respective variable, based on the count, and applying the decision by the respective variable-node circuit.

10. The method according to claim 9, wherein the ECC comprises an irregular Low-Density Parity-Check (LDPC) code, in which at least a first variable and a second variable among the multiple variables of the ECC participate in different respective first and second numbers of the check equations.

11. The method according to claim 9, wherein the scheduling scheme assigns to a given iteration in the sequence a respective predefined flipping threshold, wherein performing the iterations comprises, when processing a given variable-node circuit in the given iteration, flipping the binary value of the respective variable when the count of the given variable-node circuit exceeds the flipping threshold assigned to the given iteration.

12. The method according to claim 11, wherein the scheduling scheme specifies that a variable-node circuit in a given iteration is to be skipped when the flipping threshold assigned to the given iteration is larger than a number of check equations in which the respective variable participates.

13. The method according to claim 11, wherein the scheduling scheme assigns to successive iterations in the sequence respective numerical flipping thresholds that form a non-increasing sequence.

14. The method according to claim 11, wherein for each iteration in the sequence, the scheduling scheme assigns multiple different flipping thresholds to multiple respective variable-node circuits whose variables appear in different respective numbers of check-equations.

15. The method according to claim 9, wherein the variable-node circuits are partitioned into groups so that at least one of the groups comprises multiple variable-node circuits, wherein the scheduling scheme specifies processing or skipping variable-node circuits at a group level, and wherein making the decision comprises deciding to process or skip an entire group of variable-node circuits in accordance with the scheduling scheme.

16. The method according to claim 9, wherein performing the iterations comprises stopping decoding when all of the check equations are satisfied or when a number of processed iterations exceeds a predefined maximal number.

* * * * *